(12) United States Patent
Hu et al.

(10) Patent No.: US 7,158,545 B2
(45) Date of Patent: Jan. 2, 2007

(54) TERAHERTZ LASERS AND AMPLIFIERS BASED ON RESONANT OPTICAL PHONON SCATTERING TO ACHIEVE POPULATION INVERSION

(75) Inventors: Qing Hu, Wellesley, MA (US); Benjamin S. Williams, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 150 days.

(21) Appl. No.: 10/661,831

(22) Filed: Sep. 12, 2003

(65) Prior Publication Data

US 2005/0058168 A1 Mar. 17, 2005

(51) Int. Cl.
H01S 5/00 (2006.01)
(52) U.S. Cl. .................................... 372/4; 372/45.012
(58) Field of Classification Search .......... 372/45.012, 372/4
See application file for complete search history.

(56) References Cited

U.S. PATENT DOCUMENTS

| | | | |
|---|---|---|---|
| 5,457,709 | A | 10/1995 | Capasso et al. |
| 5,509,025 | A | 4/1996 | Capasso et al. |
| 5,745,516 | A | 4/1998 | Capasso et al. |
| 5,936,989 | A | 8/1999 | Capasso et al. |
| 6,144,679 | A | 11/2000 | Herman et al. |
| 6,154,475 | A | 11/2000 | Soref et al. |
| 6,188,477 | B1 | 2/2001 | Pu et al. |
| 6,370,219 | B1 | 4/2002 | Peale |
| 6,472,683 | B1 | 10/2002 | Li |
| 6,563,622 | B1 | 5/2003 | Mueller et al. |
| 6,829,269 | B1 * | 12/2004 | Goodhue et al. ........ 372/43.01 |
| 2003/0219052 | A1 * | 11/2003 | Goodhue et al. ............. 372/45 |

OTHER PUBLICATIONS

Williams et al. "3.4 THz quantum cascade laser operating above liquid nitrogen temperature" Elec. Letter., vol. 39, No. 12 (Jun. 12, 2003).*
Kazarinov and Suris, "Possibility of the amplification of electromagnetic waves in a semiconductor and superlattice," Sov. Phys. Semicond. 5, 707 (1971).
Faist, et al., "Quantum cascade laser," Science 264, 477 (1994).
Beck, et al., "Continuous Wave Operations of a Mid-infrared Semiconductor Laser at Room Temperature," Science 295, 301 (2002).
Helm, et al., "Intersubband Emission from Semiconductor Superlattices Excited by Sequential Resonant Tunneling," Phys. Rev. Lett. 63, 74 (1989).

(Continued)

Primary Examiner—Minsun Oh Harvey
Assistant Examiner—Tod T. Van Roy
(74) Attorney, Agent, or Firm—Thomas J. Engellenner; Reza Mollaaghababa; Nutter McClennen & Fish LLP

(57) ABSTRACT

The present invention provides quantum cascade lasers and amplifier that operate in a frequency range of about 1 Terahertz to about 10 Terahertz. In one aspect, a quantum cascade laser of the invention includes a semiconductor heterostructure that provides a plurality of lasing modules connected in series. Each lasing module includes a plurality of quantum well structure that collectively generate at least an upper lasing state, a lower lasing state, and a relaxation state such that the upper and the lower lasing states are separated by an energy corresponding to an optical frequency in a range of about 1 to about 10 Terahertz. The lower lasing state is selectively depopulated via resonant LO-phonon scattering of electrons into the relaxation state.

28 Claims, 10 Drawing Sheets

OTHER PUBLICATIONS

Kohler, et al., "Terehertz semiconductor-heterostructure laser," Nature, 417, 156 (2002).

Tredicucci et al. "High performance interminiband quantum cascade lasers with graded superlattice," Appl. Phys. Letter. 73, 2101 (1998).

Rochat, et al., "Low-threshold terahertz quantum-cascade lasers," Appl. Phys. Lett. 81, 1381 (2002).

Williams, et al., "3.4-THz quantum cascade laser based on Longitudunal-optical-phonon scattering for depopulation," Appl. Phys., Lett. 82, 1015 (2003). Also published in Virtual Journal of Nanoscale Science & Technology, 7(8) (2003).

Unterrainer, et al., "Quantum cascade lasers with double metal-semiconductor waveguide resonators," Appl. Phys. Lett. 80, 3060 (2002).

Lee, et al., "Au-In bonding below the eutectic temperature," IEEE Trans. Comp, Hybrids, Manuf. Technol. 16, 311 (1993).

Wang, et al., "Die bonding with Au/In isothermal solidification technique," J. Electron. Mat. 29, 443 (2000).

Wang, et al., "Stable and shallow PdIn ohmic contancts to n-GaAs," Appl. Phys. Lett. 56, 2129 (1990).

Troccoli, et al., "Mid-infrared (n = 7.4 um) quantum cascade laser amplifier for high power single-mode emission and improved beam quality," Appl. Phys. Lett. 80, 4103 (2002).

Mueller, et al., "2.5 THz Laser Local Oscillator for the EOS Chem 1 Satellite," Proceedings of the Ninth International Space Terahertz Technology Symposium, pp. 563-572, Pasadena, CA, Mar. 17-19 (1998).

Williams, et al., "Narrow-linewidth terahertz intersubband emission from three-level systems," American Institute of Physics (1999).

Williams and Hu, "Optimized energy separation for phonon scattering in three-level terahertz intersubband lasers," American Institute of Physics (2001).

Xu and Hu, "Electrically pumped tunable terahertz emitter based on intersubband transition," American Institute of Physics (1997).

Faist, et al., "Bound-to-Continuum and Two-Phonon Resonance Quantum-Cascade Lasers for High Duty Cycle, High-Temperature Operation," IEEE (2002).

* cited by examiner

TERAHERTZ LASERS AND AMPLIFIERS BASED ON RESONANT OPTICAL PHONON SCATTERING TO ACHIEVE POPULATION INVERSION

STATEMENT REGARDING FEDERALLY SPONSORED RESEARCH

This invention was made with government support under Contract No. PO#P927326 awarded by AFOSR, Contract No. NAG5-9080 awarded by NASA, and Contract No. ECS-0217782 awarded by NSF. The government has certain rights in the invention.

BACKGROUND OF THE INVENTION

The present invention pertains generally to quantum cascade lasers (QCL), and more particularly, it relates to quantum cascade lasers that operate in the terahertz region of the electromagnetic spectrum.

The terahertz region (e.g., ~1–10 THz, corresponding to a wavelength $\lambda$=30–300 µm or a photon energy $\hbar\omega \approx$ 4–40 meV) of the electromagnetic spectrum falls between microwave/millimeter and near-infrared/optical frequency ranges. Numerous coherent radiation sources have been developed in the microwave/millimeter and near-infrared/optical frequency ranges. However, despite potential applications of terahertz radiation in a variety of different fields (e.g., spectroscopy in chemistry and biology, plasma diagnostics, remote atmospheric sensing and monitoring, and detection of bio- and chemical agents and explosives for security and military applications), coherent radiation sources operating in the terahertz region remain scarce. The difficulties in developing such radiation sources can be appreciated by considering that semiconductor devices, such as, Gunn oscillators, or Schottky-diode frequency multipliers, that utilize classical real-space charge transport for generating radiation exhibit power levels that decrease as the fourth power of radiation frequency $$\left(\frac{1}{f^4}\right)$$

as the radiation frequency (f) increases above 1 THz. Further, the radiation frequencies obtained from photonic or quantum electronic devices, such as laser diodes, are limited by the semiconductor energy bandgap of such devices, which is typically higher than 10 THz even for narrow gap lead-salt materials. Thus, the frequency range below 10 THz is not accessible by employing conventional semiconductor laser diodes.

Some unipolar quantum well semiconductor lasers operating in the mid-infrared portion of the electromagnetic spectrum are known. For example, electrically pumped unipolar intersubband transition lasers, commonly known also as quantum cascade lasers, operating at a wavelength of 4 microns were developed at Bell Laboratories in 1994. Since then, major improvements in power levels, operating temperatures, and frequency characteristics have been made for mid-infrared QCLs.

In contrast to such developments of QCL's in the mid-infrared range, the development of terahertz quantum cascade lasers in a frequency range below 10 THz has been considerably more challenging. In particular, small separation of lasing energy levels (about 10 meV), coupled with difficulties associated with mode confinement, at these frequencies contribute to challenges in developing such lasers.

Hence, there is a need for coherent terahertz radiation sources, particularly, coherent sources that generate radiation in a frequency range of about 1 to about 10 THz.

There is also a need for efficient methods for mode confinement in such terahertz lasers.

SUMMARY OF THE INVENTION

In one aspect, the present invention provides terahertz quantum cascade lasers that operate in a frequency range of about 1 to about 10 Terahertz. A quantum cascade laser of the invention can include an active region generally formed as a semiconductor heterostructure that provides a plurality of lasing modules connected in series. Each lasing module includes at least an upper lasing state, a lower lasing state and a relaxation state. The upper and the lower lasing states are separated in energy by a value corresponding to an optical frequency in a range of about 1 to about 10 Terahertz. Hence, optical radiative transitions between the upper lasing state and the lower lasing state generate radiation having a frequency in a range of about 1 to about 10 Terahertz.

Applicants have discovered that a highly selective and very fast depopulation of the lower lasing state can be achieved by employing resonant LO-phonon scattering of electrons populating the lower lasing state into the relaxation state. For example, the rate of depopulation scattering can be higher than $10^{12}$ s$^{-1}$ (a lifetime of the lower lasing state being less than 1 psec), and further it can be largely insensitive to operating temperature. This feature advantageously facilitates generation of a population inversion between the upper and the lower lasing states. More particularly, the energy separation of the lower lasing state and the relaxation state is designed to allow resonant LO-phonon scattering of electrons from the lower lasing state into the relaxation state. In other words, this energy separation is approximately equal to the energy of at least one LO-phonon mode of the heterostructure.

As is known in the art, the rate of radiative transitions between the lasing states and the non-radiative transitions between the lasing states and the relaxation state are determined not only by energy separation between these states, but also by the shapes of the wavefunctions associated with these states. In a terahertz laser of the invention, the wavefunction of the lower lasing state of each lasing module has a substantial coupling to that of the relaxation state while the corresponding coupling between the upper lasing state and the relaxation state is substantially diminished. This can be accomplished, for example, by placing another state (e.g., level 3 in FIG. 5) at resonance with the lower lasing state. This other state, which can be primarily located in the same well as the relaxation state, couples strongly with the relaxation state. When this other state (level 3) and the lower lasing state (e.g., level 4 in FIG. 5) are brought into resonance through a bias voltage, the lower lasing state becomes strongly coupled to the relaxation state as well. However, the upper lasing state (e.g., level 5 in FIG. 5) is far from resonance and only weakly coupled to the relaxation state. As a result, despite a small energy separation between the upper and the lower lasing states relative to their energy separation from the relaxation state, the lower lasing state exhibits non-radiative transition rate into the relaxation state that is considerably faster (e.g., by a factor of ~10) than the corresponding transition rate of the upper lasing state. For example, a ratio of the non-radiative transition rate of the lower lasing state into the relaxation state relative to a corresponding rate of the upper lasing state can be in a range of about 5 to about 10. These factors enhance the non-radiative lifetime of the upper lasing state relative to that of the lower lasing state, thereby facilitating generation of a population inversion between these two states. For example, the lifetime of the upper lasing state can be approximately 10 times longer than that of the lower lasing state. In addition, the wavefunctions of the upper and lower lasing states are designed such that their coupling is sufficiently strong to allow fast radiative transitions between the upper and the lower lasing states, thereby enhancing lasing efficiency.

In one aspect, a quantum cascade laser of the invention includes electrical contacts that can apply a bias voltage across the heterostructure forming the active region of the laser. The bias voltage causes a shift in the energy levels of various states of the lasing modules such that a relaxation state of each module is in substantial resonance with an upper lasing state of an adjacent module to allow resonant tunneling of electrons from the relaxation state into the adjacent upper lasing state.

An active region of a quantum cascade laser of the invention as described above can be formed, for example, as a cascaded series of alternating layers of GaAs and $Al_xGa_{1-y}As$ sandwiched between an upper contact layer and a lower contact layer, wherein the aluminum concentration (x) can range from about 15% to about 30%, and the gallium concentration (y) can range from about 65% to about 80%. Those having ordinary skill in the art will appreciate it that other concentration ranges may also be suitable for the practice of the invention. The contact layers can be, for example, heavily doped (e.g., with Si dopants that provide n-type doping) GaAs layers (e.g., a doping level of about $3\times10^{18}$ $cm^{-3}$). The heterostructure and the contact layers can be formed on a semi-insulating substrate, e.g., a semi-insulating GaAs layer.

In a related aspect, a quantum cascade laser of the invention can include a waveguide coupled to the active region for confining selected lasing modes. Such a waveguide can be formed, for example, as a metallic layer and a heavily doped semiconductor layer, for example, a heavily doped GaAs layer, that provides mode confinement via surface plasmons. More preferably, the waveguide is formed of two metallic layers, for example, two gold layers, between which the active region is disposed.

A terahertz quantum cascade laser of the invention has been demonstrated to operate at temperatures up to about 137 K (e.g., at temperatures in a range of about 5K to 137 K). Generally, the invention provides the opportunity for fabricating quantum cascade lasers that can operate at even higher temperature (for example, at room temperature)

In another aspect, the invention provides an amplifier capable of operating in a range of about 1 to about 10 THz that includes an amplification region formed as a heterostructure that provides an upper and a lower amplification states and a relaxation state. The lower amplification state exhibits a non-radiative coupling to the relaxation state via resonant LO-phonon scattering. The amplifier includes an input port for optically coupling incoming radiation to the amplification region to generate an amplified signal that can be extracted from the amplifier via an output port.

DETAILED DESCRIPTION

Figure 1:
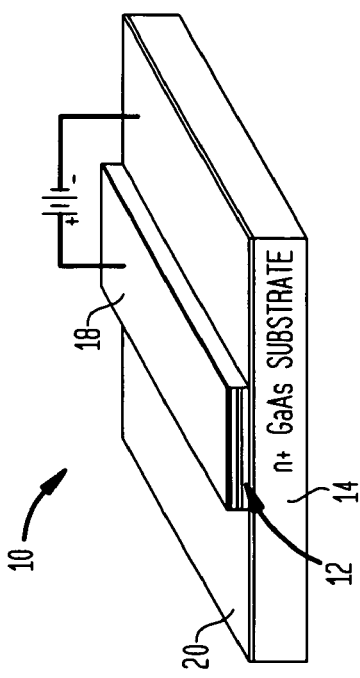
FIG. 1 is a perspective schematic view of a quantum laser according to the teachings of the invention.
Figure 2:
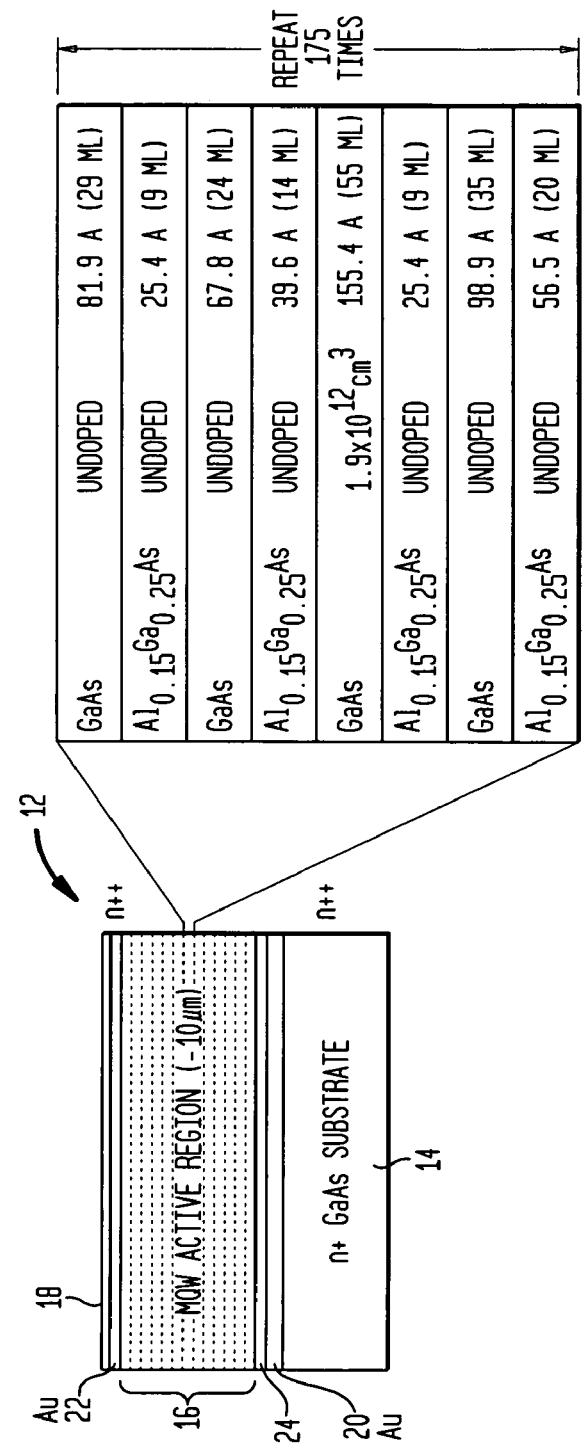
FIG. 2 is a cross-sectional view of the laser of FIG. 1 illustrating a heterostructure forming the laser's active region, FIGS. 3A–3E schematically illustrate various steps in an exemplary fabrication method for generating a double-sided metal waveguide for use in a terahertz laser according to one embodiment of the invention.

With reference to FIGS. 1 and 2, an exemplary quantum cascade laser 10 according to one exemplary embodiment of the invention includes an active lasing region 12 formed as a heterostructure on a GaAs substrate (for example, an n+ GaAs substrate) 14. The active region 12, which can have a thickness in a range of about 3 microns to about 10 microns (in this exemplary embodiment, the active region has a thickness of about 10 microns), includes a plurality of cascaded nominally identical repeat lasing modules 16, which are coupled in series. The number of the lasing modules can range, for example, from about 100 to about 200. In this exemplary embodiment, the number of lasing modules is selected to be 175.

Each lasing module can be formed as a GaAs/$Al_{0.15}Ga_{0.85}As$ heterostructure. For example, as shown in FIG. 1, in this embodiment, each lasing module, which has an approximate thickness of 600 angstroms, is formed as a stack of alternating $Al_{0.15}Ga_{0.85}As$ and GaAs layers having the illustrated thicknesses. The heterostructure of each lasing module provides four quantum wells that collectively generate lasing and relaxation states, as described in more detail below. More particularly, each GaAs layer sandwiched between two $Al_{0.15}Ga_{0.85}As$ barrier layers functions as a two-dimensional quantum well.

The term "quantum well" is known in the art. To the extent that a definition may be needed, a "quantum well," as used herein, refers to a generally planar semiconductor region, having a selected composition, that is sandwiched between semiconductor regions (typically referred to as barrier layers) having a different composition, commonly selected to exhibit a larger bandgap energy than that of the composition of the quantum well layer. The spacing between the barrier layers, and consequently the thickness of the quantum well layer, are selected such that charge carriers (e.g., electrons) residing in the quantum well layer exhibit quantum effects in a direction perpendicular to the layer (e.g., they can be characterized by discrete quantized energy states).

Two parallel metallic layers 18 and 20, formed of gold in this embodiment, provide a double sided metal waveguide for confining the lasing modes of the laser 10. The double-sided metal waveguide tightly confines the radiation field, thus yielding a confinement factor close to unity, as discussed in more detail below. Further, as shown in FIG. 1, the upper and lower metallic layers 18 and 20 can be utilized to apply a selected bias voltage across the active region to cause shifting of the energy levels, and injection of electrons into the active region, as discussed in more detail below.

Two heavily doped GaAs upper and lower contact layers 22 and 24 are employed to provide low-resistive contact between the metal layers and the semiconductor active region. In this exemplary embodiment, the upper contact layer 22, which has a thickness of about 60 nm has a doping level of about $n=5\times10^{18}$ $cm^{-3}$, and the lower contact layer 24, which has a thickness of about 100 mm, has a doping level of about $n=3\times10^{18}$ $cm^{-3}$. Those having ordinary skill in the art will appreciate that other doping levels can also be utilized.

The operation of a terahertz quantum cascade laser of the invention, such as the above exemplary laser 10, will be discussed in more detail below. However, briefly, in operation, electrons injected into the active region populate an upper lasing state of a lasing module, and generate lasing radiation via optical transitions to a lower lasing state of the module. The energy separation of the upper and the lower lasing states corresponds to a frequency in a range of about 1 to about 10 THz (a wavelength range of about 30 to 300 microns), and hence the lasing radiation has a frequency in this range. The lower lasing state is depopulated via resonant LO-phonon scattering into a relaxation state. The applied bias voltage causes the relaxation state to be in energetic proximity of an upper lasing state of an adjacent lasing module. This allows resonant tunneling of electrons from the relaxation state into the upper lasing state of an adjacent module in a cascading fashion.

The active region 12 can be formed as a heterostructure by employing, for example, molecular beam epitaxy (MBE), chemical vapor deposition (CVD), or any other suitable technique known in the art. A low temperature wafer bonding technique, described in detail below, can be employed to generate the double-sided metal waveguide.

With reference to FIGS. 3A–3E, an exemplary fabrication method for generating the metallic layers 18 and 20 employs a low temperature metal wafer bonding technique followed by substrate removal. More particularly, with reference to FIG. 3A, in an initial step, a wafer 26 containing a multi quantum well (MQW) structure 28 according to the teachings of the invention, formed on a GaAs substrate, is coated with a layer of titanium (Ti) (e.g., a thickness of about 20 nm) and a layer 30 of gold (e.g., a thickness of about 1000 nm). Further, a receptor wafer 32 is prepared by depositing successive layers of palladium (Pd), germanium (Ge), palladium (Pd), indium (In), and gold (Au) on a doped n+ GaAs substrate 34. The Pd/Ge/Pd multi-layer advantageously improves electrical contact to the receptor layer while the topmost gold layer minimizes oxidation of the indium layer.

Figure 3A:
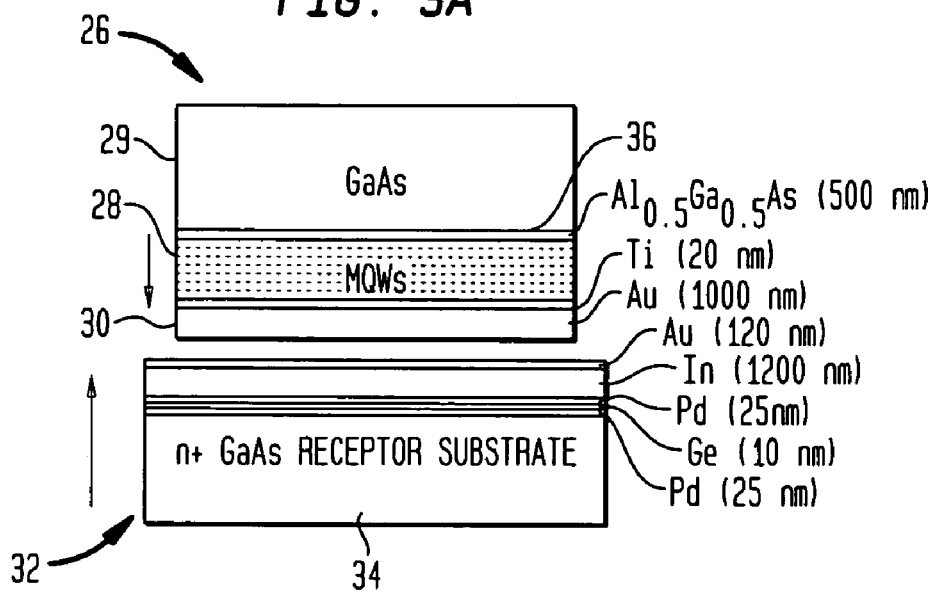
Figure 3B:
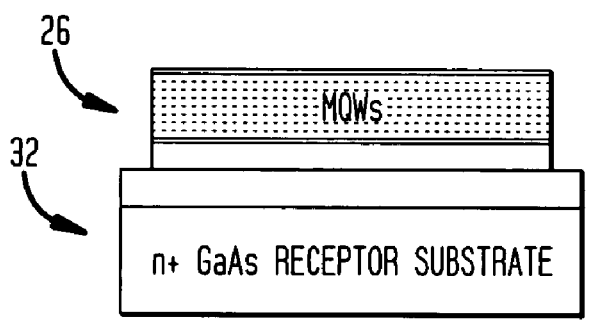

With reference to FIG. 3B, the two wafers 26 and 32 are bonded together and the GaAs layer 29 is removed. For example, in this exemplary embodiment, wafer pieces having a cross-sectional area of about 1 $cm^{-2}$ were cleaved and bonded by maintaining stacked wafers at a temperature of about 250 C on a hot plate for a time duration of about 10 minutes while pressure was applied to the stack. Care was taken to maintain alignment of the crystal axes of the two wafers. Bonding takes place as the indium layer melts, wets the surface to fill in any crevices, and then diffuses into the gold layer to reactively form a variety of In—Au alloys. When the layer thicknesses are properly selected, the indium layer is entirely consumed, and the bonding remains robust up to the eutectic temperature (about 450 C) of the In—Au alloys. The GaAs substrate 29 can be first mechanically lapped and then chemically etched in $NH_4OH:H_2O_2$ to cause its removal. This selective etch can be stopped at a $Al_{0.5}Ga_{0.5}As$ etch stop layer 36, which can be subsequently removed by employing HF acid.

Figure 3C:
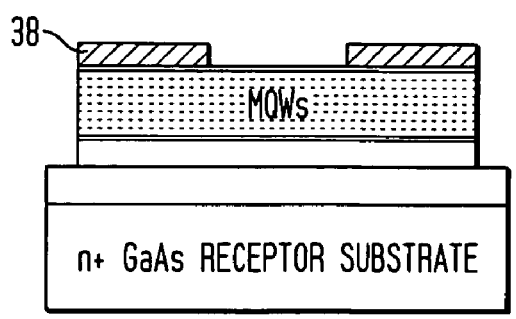
Figure 3D:
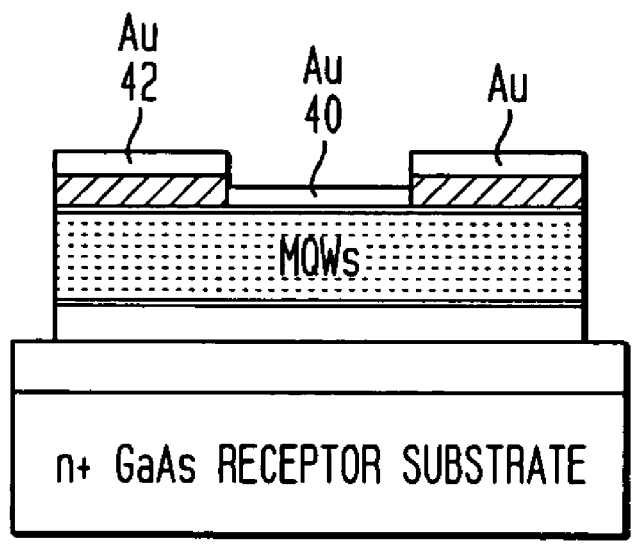
Figure 3E:
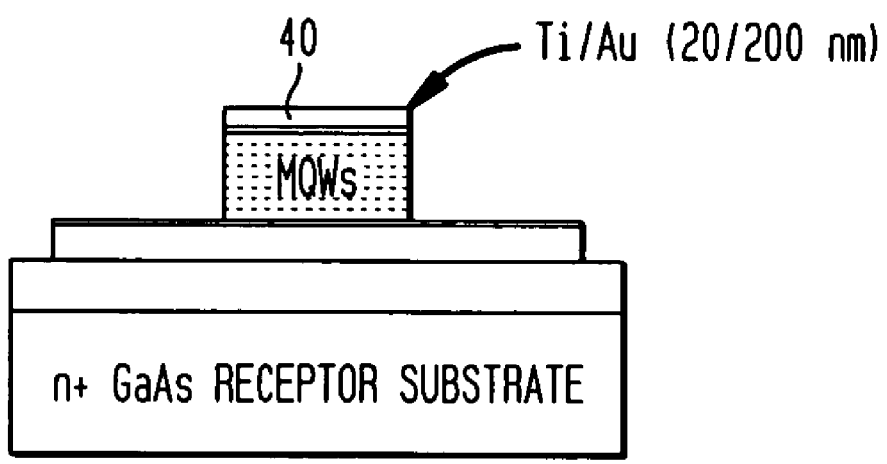

With reference to FIG. 3C, subsequently, a lithographic mask 38 is applied to the upper surface of the active region by employing known techniques to pattern the surface so as to provide an opening in a central portion of the surface while covering the remainder of the surface. As shown in FIG. 3D, gold is then deposited over the mask to form a gold layer 40 in direct contact with the active region and a gold layer 42 over the lithographic mask. The lithographic mask and the gold layer are then lifted off the surface by dissolving the mask in an appropriate solvent. With reference to FIG. 3E, reactive ion etching, for example, electron cyclotron resonance reactive ion etching in a $BCl_3:N_2$ gas mixture, can then be utilized to etch the portions of the active region that are not covered by the upper gold layer so as to generate vertical sidewall profiles.

Figure 4A:
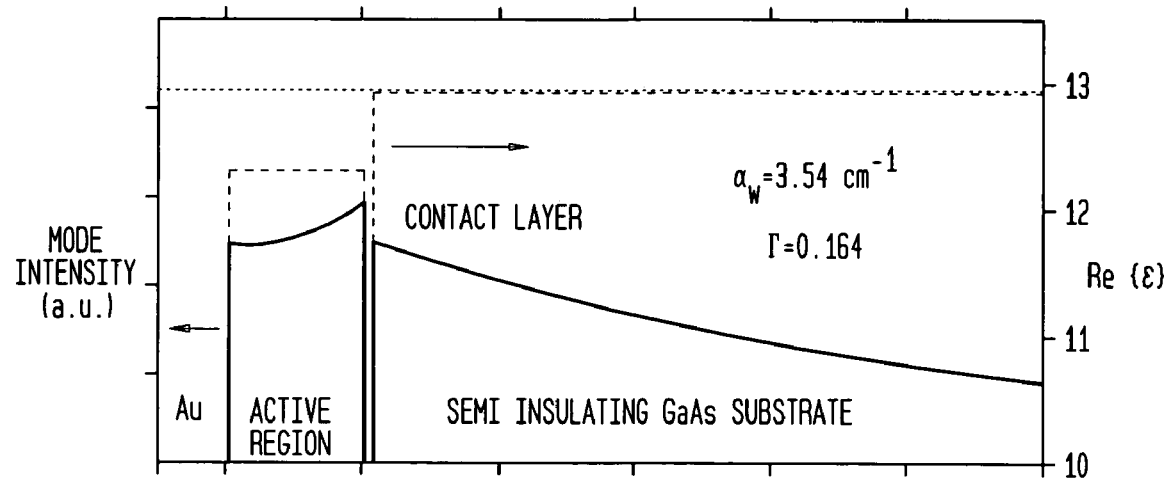
FIG. 4A depicts graphs of calculated mode profile and the real part of dielectric constant in various layers of a quantum cascade laser according to one embodiment of the invention at a wavelength of 100 microns and utilizing a waveguide formed of a metal layer and a heavily doped semiconductor layer for mode confinement.
Figure 4B:
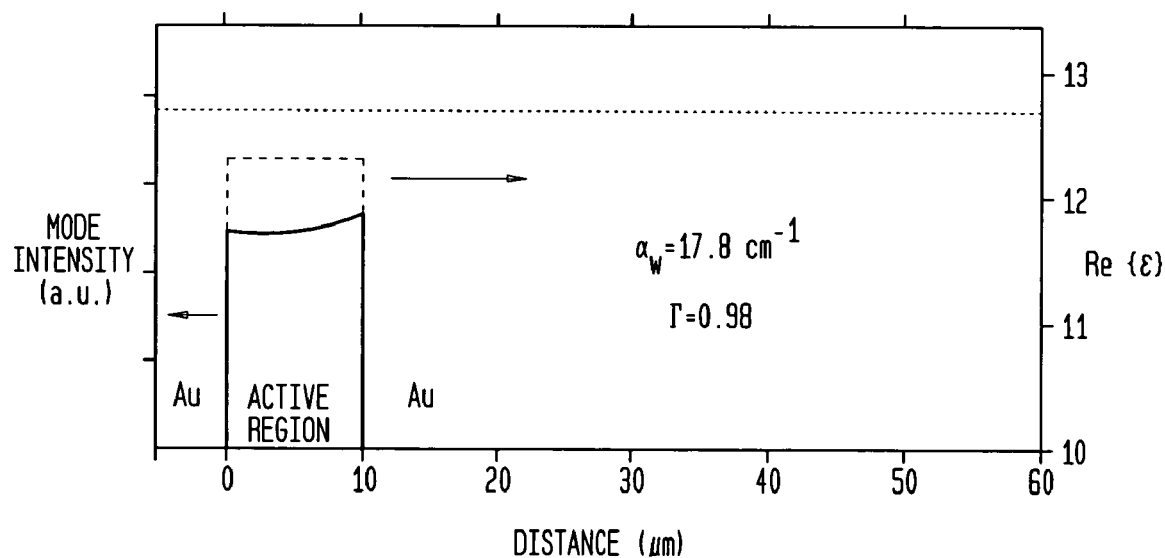
FIG. 4B depicts graphs of calculated mode profile and the real part of dielectric constant in various layers of a quantum cascade laser according to another embodiment of the invention at a wavelength of 100 microns and utilizing a double-sided metal waveguide for mode confinement.

The use of double-sided metal waveguides in quantum cascade lasers operating in a range of about 1 THz to about 10 THz according to the teachings of the invention considerably enhances mode confinement in such lasers, for example, relative to employing semi-insulating surface plasmon waveguides. For example, FIGS. 4A and 4B illustrate calculated mode intensities (solid lines) and the real part of dielectric constants ($\epsilon$) (dashed lines) at a wavelength of 100 microns in two quantum cascade lasers utilizing, respectively, a waveguide formed of one metallic layer and a semi insulating surface plasmon layer and a double sided metal waveguide. The calculations were based on Drude model for free electrons in various layers. A scattering time of 0.5 picoseconds (ps) was employed for electrons in the lightly doped active region while scattering times of 0.1 ps and 0.05 ps were utilized, respectively, for electrons in a heavily doped n+ GaAs substrate layers and in gold layers.

With continued reference to FIGS. 4A and 4B, the double-sided metal waveguide provides a mode confinement factor close to unity ($\Gamma=0.98$), which is considerably larger than the mode confinement factor ($\Gamma=0.164$) provided by the surface plasmon waveguide. In particular, while the modal intensity in the laser structure having a surface plasmon waveguide extends considerably into the GaAs substrate (FIG. 4A), the modal intensity in the structure having a double-sided metal waveguide is confined almost completely within the active region. Thus, the structure having a double-sided metal waveguide exhibits a much lower facet loss $$\left(\frac{\alpha_m}{\Gamma}\right)$$

than the other structure, although the waveguide losses $$\left(\frac{\alpha_w}{\Gamma}\right)$$

exhibited by the two structures are comparable. Hence, utilizing a double-sided metal waveguide at a frequency in a range of about 1 THz to about 10 THz for mode confinement results in a much lower total cavity loss, thus allowing obtaining lasing radiation in structures fabricated based on this mode confinement scheme in the terahertz region of the electromagnetic spectrum.

In addition to providing enhanced mode confinement, a double-sided metal waveguide according to the teachings of the invention can also be employed as a microstrip transmission line that is compatible with integrated circuits. This feature can allow THz QCL devices based on such metal waveguide structures to be readily integrated with other semiconductor devices and circuits.

Figure 5:
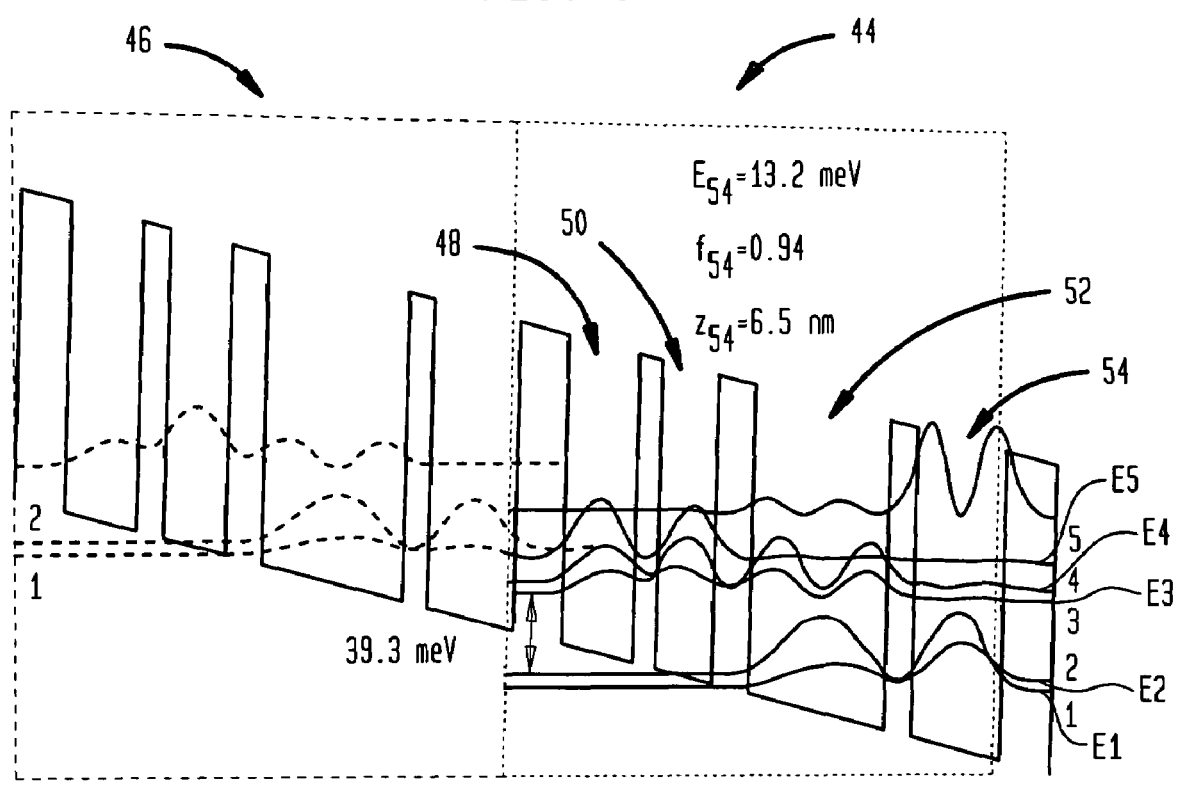
FIG. 5 illustrates an exemplary calculated conduction band profile of two lasing modules of a quantum cascade laser fabricated in accordance with the teachings of the invention.

The operation of a quantum cascade laser fabricated in accordance with the teachings of the invention can be better understood by reference to FIG. 5 that schematically illustrates a calculated conduction band profile corresponding to the above exemplary lasing structure 10 of the present exemplary embodiment. Although only two adjacent lasing modules are illustrated in FIG. 5, those having ordinary skill in the art will appreciate that this exemplary illustration is applicable to other modules in the active region. This exemplary conduction band profile depicts the energy levels of two adjacent lasing modules 44 and 46 upon application of a bias voltage of 65 mV/module to the active region. For example, the module 44, which includes four quantum wells 48, 50, 52, and 54, includes quantum states E5, E4, E3, E2, and E1. The adjacent lasing module 46 includes similar energy states, albeit shifted in energy relative to the corresponding states in the module 44 as a result of application of the bias voltage. Each energy state is characterized by a wavefunction whose modulus is indicative of the probability distribution of an electron residing in that state.

The states E5 and E4 form, respectively, an upper lasing state and a lower lasing state of the module 44. In preferred embodiments of the invention, the upper lasing state E5 is separated from the lower lasing state E4 by an energy corresponding to an optical transition frequency in a range of about 1 to about 10 Terahertz (THz) between the two lasing states. For example, in this exemplary embodiment, the energy separation between the upper and the lower lasing states E5 and E4 can be selected to be 13.9 millielectronvolts (meV), which corresponds to an optical transition frequency of 3.38 THz (i.e., a wavelength ($\lambda$) of 88.8 microns).

The states E1 and E2 form a relaxation doublet into which electrons residing in the lasing states can transition, primarily via phonon-assisted non-radiative processes. As described in more detail below, the transition rate of electrons from the lower lasing state into the relaxation states is substantially faster than a corresponding transition rate from the upper lasing state into the relaxation state. This difference in transition rates advantageously facilitates generation of a population inversion between the two lasing states. More particularly, at the design bias voltage, the state E3 is brought into resonance with the lower lasing state E4 with a small anticrossing gap, for example, a gap of about 5 meV for a bias voltage of 64 meV in this exemplary embodiment. The state E3 exhibits a fast relaxation rate via resonant LO-phonon scattering into the relaxation double E1/E2. This allows fast resonant LO-phonon scattering from the lower lasing state E4 into the relaxation states to selectively depopulate the lower lasing state, thereby facilitating generation of a population inversion between the lasing states.

A calculation of LO-phonon scattering rates for the exemplary lasing structure 10, performed by employing bulk GaAs phonon modes (a good approximation for structures with low aluminum content), indicates a phonon scattering rate of about $1.8 \times 10^{12}$ $s^{-1}$ (corresponding to a scattering time of ~0.55 ps) from the lower lasing state into the relaxation doublet (a lifetime of the lower lasing state into the relaxation doublet being $\tau_4$ (2,1)=0.55 ps). Further, assuming a fully coherent tunneling process between levels E3 and E4, electron-electron scattering from the lower lasing state E4 into the state E3, which has a short lifetime (e.g., about 0.46 ps for transitions into the relaxation doublet), can cause further depopulation of the lower lasing state.

In contrast, the non-radiative relaxation of the upper lasing state E5 into the states E4 and E3 is suppressed at low temperatures as emission of LO-phonons that can cause such transitions is energetically forbidden (i.e., the energy separation of E5 and E4 can be less than phonon energy). Further, as described in more detail below, the wavefunction of the the upper lasing state and and those of the relaxation states are designed to exhibit poor coupling with one another, thus minimizing non-radiative transitions from the upper lasing state into the relaxation state. Hence, the lifetime of the upper lasing state is substantially longer than that the lifetime of the lower lasing state. For example, in this exemplary embodiment, the lifetime of the lower lasing state $\tau_4$ is about 0.5 ps whereas the lifetime of the upper lasing state $\tau_5$ is about 7 ps. It should be understood that the above calculated numerical values are presented only for further elucidation of salient features of the invention, and are not intended to provide actual values of relaxation rates in all quantum cascade lasers fabricated in accordance with the teachings of the invention.

As is known in the art, the rate of a radiative transition between the lasing states, and the rates of non-radiative transitions between each of the lasing states and the relaxation states are determined, in part, by the shapes of the wavefunctions of these states. In other words, the spatial probability of electron distribution in these states play a role in establishing these transition rates. The selective depopulation of the lower lasing state via resonant LO-phonon scattering can be perhaps better understood by noting that in quantum cascade lasers of the invention, the wavefunctions of the lasing states and the relaxation state (or states) are designed such that the lower lasing state has a substantial coupling to that of the relaxation state while the corresponding coupling between the upper lasing state and the relaxation state is minimized. Moreover, the energy separation of the lower lasing state and the relaxation state (or states) is designed to allow resonant LO-phonon scattering from the lower lasing state into the relaxation state. In addition, the wavefunctions of the two lasing states are designed to exhibit a sufficiently strong coupling that allows efficient radiative transition between these two states.

For example, in this exemplary embodiment, the wavefunction of the upper lasing state E5 has a substantial amplitude in the quantum wells 48 and 50 while exhibiting a substantially diminished amplitude in the quantum wells 52 and 54. In contrast, the wavefunction of the lower lasing state E4 exhibits robust amplitudes in the quantum wells 48 and 50, as well as in quantum well 52, but it has a much lower, amplitude in the quantum well 54. The relaxation states E1 and E2 exhibit very low amplitudes in the quantum wells 48 and 50, but have substantial amplitudes in the quantum wells 52 and 54. Further, the quantum state E3 has a substantial amplitude in the quantum well 52, and a somewhat lower amplitude in the quantum well 48. A coupling between two wavefunctions as used herein, is a measure of an spatial extent over which both wavefunctions have non-vanishing (or substantial) amplitudes. For example, a coupling between two wavefunctions can be obtained by integrating a product of the two wavefunctions over a selected spatial extent. Alternatively, a coupling between two wavefunctions can be obtained by calculating the expectation value of an operator (e.g., dipole moment operator) between the two wavefunctions. A review of the above wavefunctions reveals that the coupling between the wavefunction of the lower lasing state and those of the relaxation states is much more enhanced relative to a similar coupling between the wavefunction of the upper lasing state and those of the relaxation states. More specifically, the wavefunction of the lower lasing state, and that of the state E3 that is in resonance with the lower lasing state, and those of the relaxation states have substantial amplitudes in the quantum well 52, whereas the wavefunction of the upper lasing state has approximately vanishing values in the quantum wells 52 and 54 in which the wavefunctions of the relaxation states peak. Hence, the rate of non-radiative transitions from the lower lasing state into the relaxation state is much higher (e.g. about 10 times larger) than a corresponding rate associated with the upper lasing state.

Further, there exists a good coupling between the wavefunctions of the upper and the lower lasing states because both wavefunctions exhibit substantial amplitudes in the quantum wells 48 and 50. In other words, a radiative transition between the lasing states E5 and E4 is spatially vertical, i.e., it involves electronic transitions within the same quantum well rather than between adjacent quantum wells, thus yielding a large oscillator strength $f_{54}$, e.g., an oscillator strength of about 0.96 in this embodiment. A large oscillator strength advantageously allows efficient lasing between these two states.

With continued reference to FIG. 5, the relaxation states E1' and E2' of the adjacent lasing module 46 are shifted in energy relative to the corresponding relaxation states of the lasing module 44, as a result of application of the bias voltage, so as to be in energetic proximity of the upper lasing state E5. The small energy separation between the states E1' and E2' and the upper lasing state E5 allows transfer of electrons, via resonant tunneling, from the states E1' and E2' into the upper lasing state E5, thereby providing a mechanism for populating the upper lasing state E5.

During operation of the laser, electrons are injected into the lasing structure 10, and are transferred from the relaxation state(s) of one lasing module to the upper lasing state of an adjacent lasing module in a cascading fashion. The transfer of electrons into the upper lasing state, coupled with selective depopulation of the lower lasing state via resonant LO-phonon relaxation, generates a population inversion between the upper and the lower lasing states, as described above. The direct use of LO-phonons in quantum cascade lasers of the invention for depopulation of the lower lasing state offers at least two distinct advantages. First, when a relaxation state (collector state) is separated from the lower lasing state by at least $E_{LO}$ (longitudinal optical (LO) phonon energy), depopulation can be extremely fast, and it does not depend much on temperature or electron distribution. Second, the large energy separation between the lower lasing state and the relaxation state inhibits thermal backfilling of the lower lasing state. These properties advantageously allow generating lasers in the terahertz region that operate at relatively high temperatures. For example, as described in more detail below, Applicants have observed lasing in proto-type lasers fabricated in accordance with the teachings of the invention up to an operating temperature of about 137 K.

Although the operation of a quantum cascade laser of the invention was described above with reference to five quantum states in each lasing module, it should be understood that a quantum cascade laser of the invention can function with a minimum of three quantum states in each lasing module such that two of the states form an upper lasing state and a lower lasing state, and third state functions as a relaxation state for depopulating the lower lasing state via resonant LO-phonon scattering.

To illustrate the efficacy of the teachings of the invention for generating quantum cascade lasers that operate in a frequency range of about 1 to about 10 THz, a prototype quantum cascade laser, which operates at a frequency of about 3.8 THz ($\lambda \approx 79$ μm) was constructed and tested. Lasing was observed up to an operating temperature of 137 K. This proto-type lasing structure includes an active region formed of 178 cascaded lasing modules, generated over an insulating GaAs substrate by employing molecular bean epitaxy. Further, cladding and contact layers were grown in a manner described. The thickness of the undoped $Al_{0.5}Ga_{0.5}As$ etch-stop layer in this exemplary prototype structure was selected to be 0.3 microns. Further, the lower $n^+$ GaAs contact layer has a thickness of 0.8 microns and is doped at $3 \times 10^{18}$ cm$^{-3}$. Moreover, the intra-injector barrier has a thickness of 30 angstroms resulting in an anticrossing gap of 5 meV between the injector (relaxation) states (E1 and E2). A tighter injector doublet provides a more selective injection into the upper lasing state of an adjacent module. A double-sided metal waveguide was employed for mode confinement.

Figure 6:
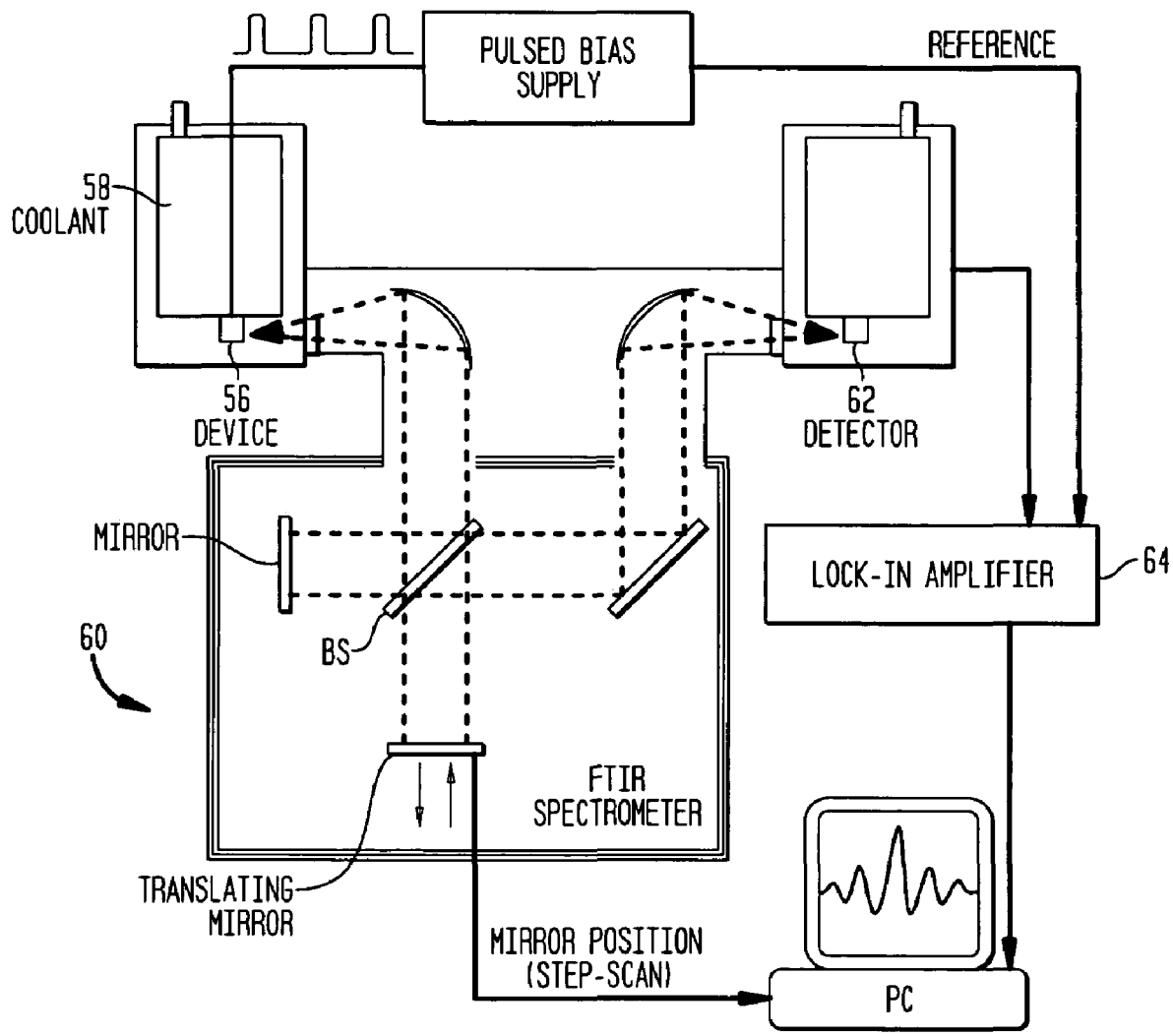
FIG. 6 is a schematic diagram of an experimental measurement system for testing proto-type quantum cascade lasers formed in accordance with the teachings of the invention.

A standard experimental set-up, shown in FIG. 6, was utilized for measurements of the prototype device's lasing emission. A device under test 56 was mounted on a heat sink 58 that was cooled by a coolant to lower the device's temperature to a desired value. A plurality of 200 ns bias pulses were applied to the device to elicit lasing emission therefrom. The lasing emission was coupled to an input of a Fourier transform spectrometer 60 operating at 0.125 cm$^{-1}$ resolution, and was detected by a Ge:Ga photodetector 62 coupled to an output of the spectrometer. The output of the detector was routed to an input of a lock-in amplifier 64 whose reference input was supplied with the pulse train. The output of the lock-in amplifier provided emission spectra of the device under test.

Figure 7:
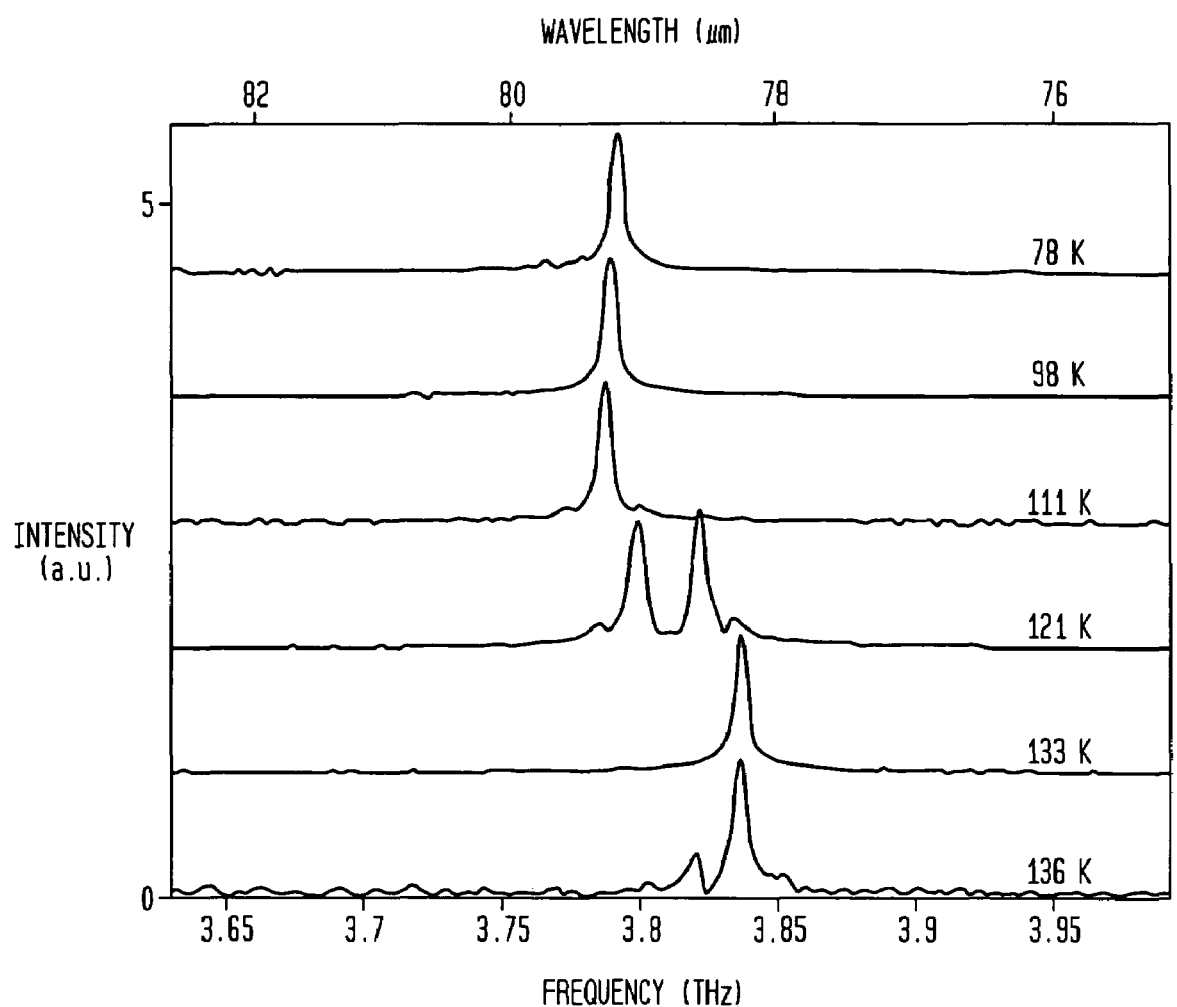
FIG. 7 illustrates a plurality of measured emission spectra of an exemplary quantum cascade laser formed in accordance with the teachings of the invention.

FIG. 7 illustrates observed lasing emission spectra at different temperatures obtained from the above proto-type device. The observed frequency shift at different temperatures is believed to be due to mode-hopping caused by the shift of the gain curve at slightly different bias points, and not to temperature tuning. The spontaneous emission linewidth is measured to be about 6 meV (about 1.5 THz). Without being limited to any theory, this broad linewidth, which is considerably different than a Lorentzian linewidth, is likely due to a non-uniform alignment of different lasing modules.

Figure 8:
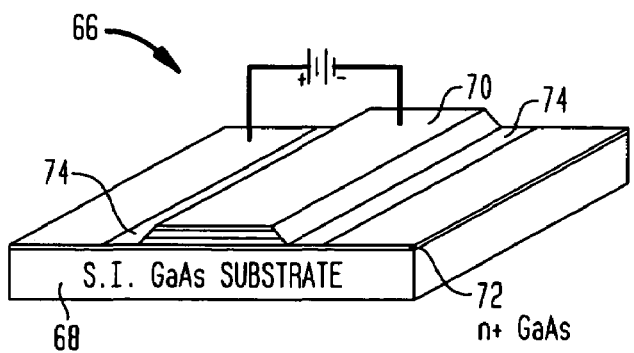
FIG. 8 is a perspective view of a quantum cascade laser according to one embodiment of the invention, which utilizes surface plasmon for mode confinement.

Although preferred embodiments of the invention employ a double-sided metal waveguide for mode confinement, in some other embodiments of the invention, mode confinement can be achieved by sandwiching an active region between a top metal layer and a heavily doped semiconductor (e.g., GaAs) bottom layer that provides a certain degree of mode confinement via surface plasmon effect. By way of example, FIG. 8 schematically depicts an exemplary quantum cascade laser 66 in accordance with one embodiment of the invention that utilizes surface plasmon for mode confinement. The exemplary laser 66 includes an active region 68 formed as a stack of a plurality of lasing modules, as described above. An upper metallic layer 70 and a heavily doped contact layer 72, for example, a contact layer having a thickness of about 0.8 microns and doped at $3 \times 10^{18}$ cm$^{-3}$ cooperatively provide confinement of the lasing modules. As the plasma frequency associated with this lower contact layer lies above the frequency of interest, a waveguide is formed between the upper metallic contact and the surface plasmons associated with the quasimetallic lower contact layer. More particularly, in this exemplary embodiment, non-alloyed ohmic contacts composed of Ti/Au are deposited on a low temperature grown n++ GaAs top contact layer. Wet etching is then utilized to pattern a few hundred microns wide (e.g., 200 µm) ridges 74. Ni/Ge/Au alloyed contacts can then be made to exposed portions of the contact layer 72 adjacent the ridges to allow, together with the metallic layer 70, application of a bias voltage across the active region.

As described in more detail below, a proto-type device that utilizes a surface plasmon waveguide was fabricated according to the above embodiment of the invention. More particularly, this prototype device included an active region formed as a GaAs/Al$_{0.15}$Ga$_{0.85}$As heterostructure fabricated on a 600 micron thick semi-insulating GaAs wafer by employing molecular beam epitaxy. The waveguide and ridges for providing ohmic contact with the lower contact layer were fabricated as described above. A Fabry-Perot cavity was formed by cleaving the structure into a 1.18 mm long bar, and the back facet was coated by evaporating Ti/Au over silicon nitride. The device was then mounted ridge side up on a copper cold finger in a helium cryostat for testing. An measurement system, such as the system shown in above FIG. 6, was then employed to obtain the presented emission data.

The device was tested at a plurality of temperatures in a range of about 5 K to about 87 K. The testing was performed by applying 200 ns long electrical pulses repeated at a rate of 1 kHz (corresponding to a 0.02% duty cycle) to the device. A Ge:Ga photodetector was utilized to measure the intensity of lasing emission. Further, a pyroelectric detector having a 2-mm diameter detecting element onto which an incoming beam can be focused by employing cone optics was utilized to calibrate measurement of absolute power. However, because the collection efficiency was considerably less than unity, the reported uncorrected power levels underestimate the actual emitted power levels. As discussed in more detail below, lasing at a frequency of about 3.4 THz was observed even at a relatively high temperature of 87 K.

Figure 9:
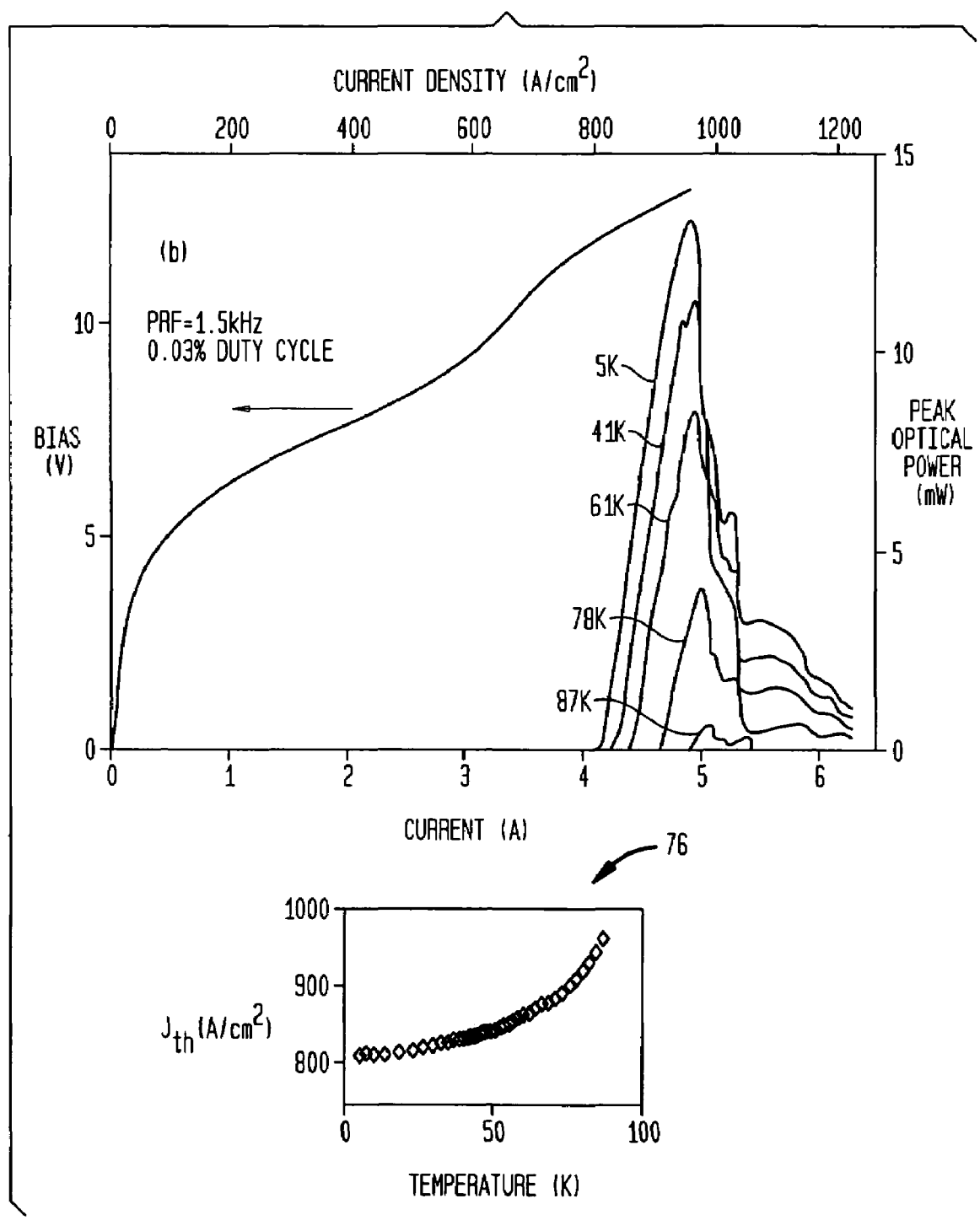
FIG. 9 presents graphs illustrating bias voltage versus injected current, as well as optical power as a function of current, in a proto-type laser formed in accordance with the embodiment of FIG. 8.

FIG. 9 presents observed laser emission power at a plurality of operating temperatures as a function of applied current in this prototype device, together with bias voltage as a function of current. At a temperature of 5K, a threshold current density ($J_{th}$) of 806 A/cm$^2$, and a peak power of ~14 mW were observed. At an operating temperature of 87 K, $J_{th}$ increased to 904 A/cm$^2$, and the peak observed power decreased to approximately ~4 mW. An insert 76 in FIG. 1 illustrates the dependence of the threshold current on operating temperature.

Figure 10:
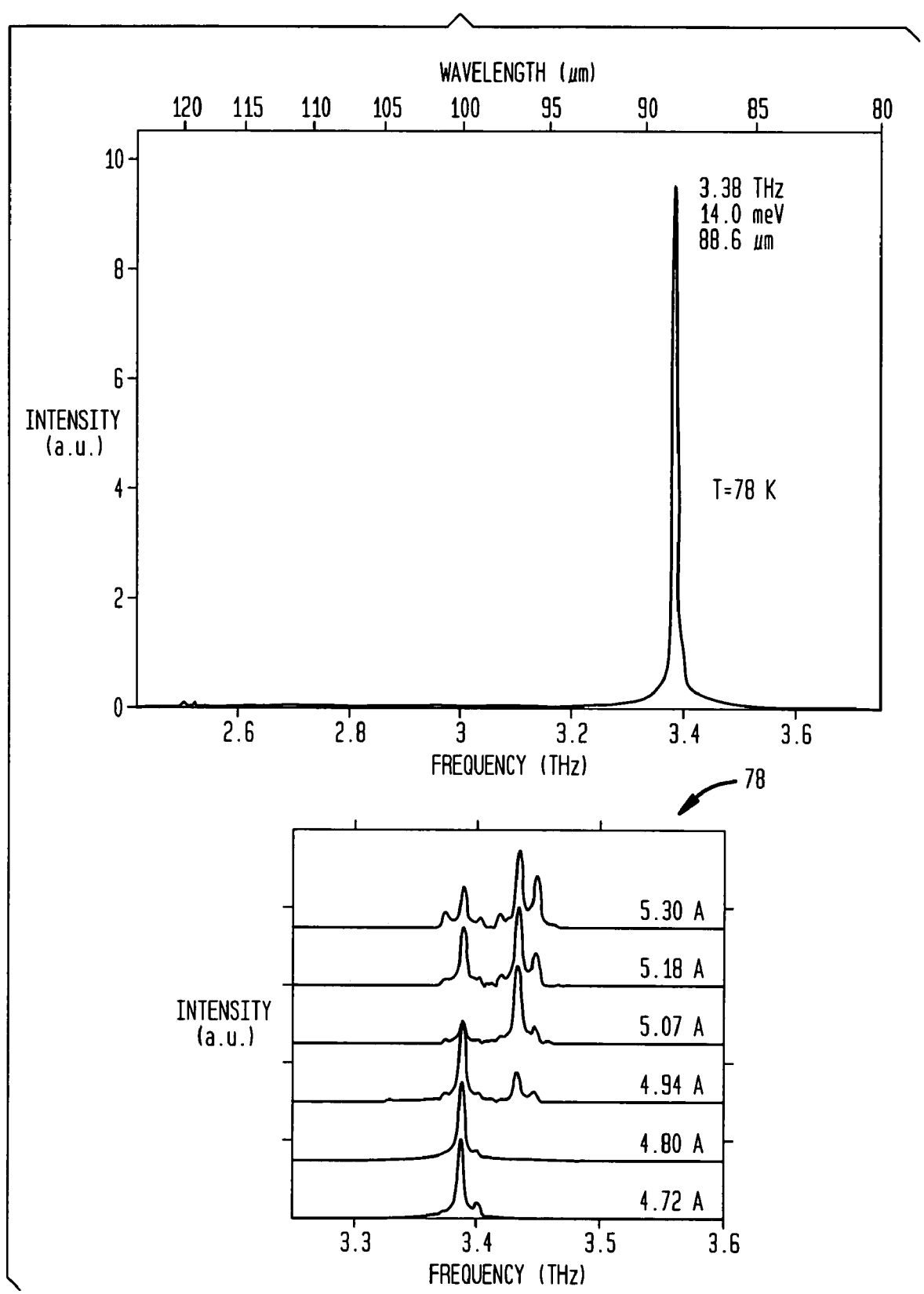
FIG. 10 illustrates a plurality of measured emission spectra obtained from a proto-type laser formed in accordance with the embodiment of FIG. 8.

FIG. 10 illustrates a typical lasing emission spectrum of this prototype laser measured at an operating temperature of 78 K. The center frequency of this emission spectrum occurs at a frequency of 3.38 THz corresponding to a wavelength of 88.6 microns (µm). An insert 78 provided in FIG. 10 illustrates a plurality of emission spectra obtained at the same temperature at different values of the injection current density. The observed lasing emission is largely single mode at lower injection currents, for example, in a range in which the slope of power-current relation is positive (i.e., current less than about 4.8 A). At high injection currents, e.g., currents above about 4.8 A, the lasing emission power decreases as injection current increases. Without being limited to any particular theory, such decrease of emission power is expected to be due to a misalignment of injector states relative to the corresponding upper lasing states receiving electrons from the injector states. Consequently, the emission spectra at high currents exhibit increasingly multi-mode behavior with shifts to higher frequencies. This blue shift of the frequency is believed to be due to the Stark shift of the intersubband transitions. A measured mode spacing at a temperature of 5 K is approximately 0.51 cm$^{-1}$, which corresponds to an effective mode index ($n_{eff}$) of 3.8±0.1. The individual modes are continuously redshifted by approximately 0.16 cm$^{-2}$ (i.e., 4.8 GHz) as the operating temperature is increased from about 5 K to about 78 K.

It should be understood that the data presented above in connection with various proto-type lasers fabricated according to the teachings of the invention are provided only for illustrative purposes, and are not intended to necessarily indicate optimal operating characteristics, such as output power or spectral lineshape, of a quantum cascade laser formed according to the teachings of the invention. Moreover, it should be understood that the teachings of the invention can be practiced to generate quantum cascade lasers that operate at frequencies other than those of the above prototype devices, and generally, in a frequency range of about 1 to about 10 THz.

Figure 11:
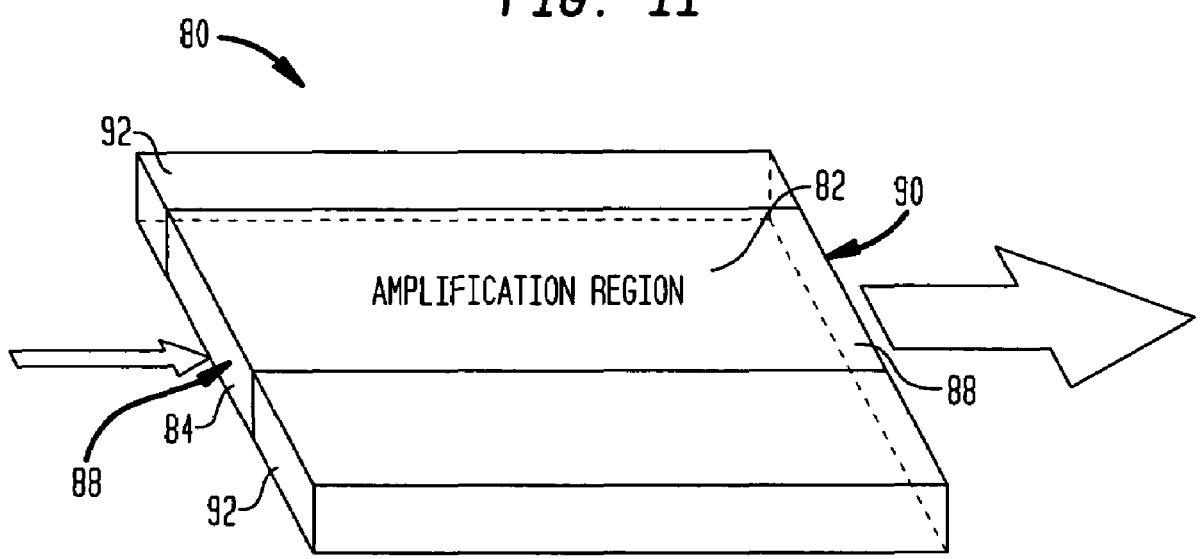
FIG. 11 is a schematic perspective view of a terahertz amplifier fabricated in accordance with the teachings of the invention.

The teachings of invention are not limited to fabricating quantum cascade lasers in a frequency range of about 1 to about 10 THz. In particular, the teachings of the invention can be applied to fabricate amplifiers in this wavelength range. By way of example, FIG. 11 schematically illustrates an amplifier 80 according to one embodiment of the invention that operates in a range of about 1 to about 10 THz. The exemplary amplifier 80 includes an active region 82 formed as a heterostructure, for example, alternating GaAs and Al$_{0.15}$Ga$_{0.85}$As layers, in accordance with the teachings of the invention, as described above. Radiation in a frequency range of 1 to 10 THz can be coupled to the active region via an input port 84. Amplified radiation can exit the active region via an output port 86. Input and output facets 88 and 90 are cleaved so as to suppress self oscillation of the amplifying structure due to reflections at these surfaces. Further, a waveguide 92, for example, a double-sided metal waveguide, confines the radiation to the amplification region.

Those having ordinary skill in the art will appreciate that various modifications can be made to the above embodiments without departing from the scope of the invention.

What is claimed is:

1. A quantum cascade laser, comprising
a semiconductor heterostructure providing a plurality of lasing modules connected in series, each lasing module comprising
a plurality of quantum well structures collectively generating at least an upper lasing state, a lower lasing state, and a relaxation state such that said upper and lower lasing states are separated by an energy corresponding to an optical frequency in a range of about 1 to about 10 Terahertz, and such that a radiative lasing transition between said upper lasing state and said lower state is spatially vertical, and
wherein electrons populating said lower lasing state exhibit a non-radiative relaxation via resonant emission of LO-phonon into said relaxation state and wherein said resonant LO-phonon emission selectively depopulates the lower lasing state such that a ratio of a lifetime of said upper lasing state relative to a lifetime of said lower lasing state is at least sbout 5.

2. The quantum cascade laser of claim 1, wherein said non-radiative relaxation of the lower lasing state into the relaxation state at a selected operating temperature of said laser is faster than a corresponding relaxation rate of said upper lasing state into said lower lasing state, and wherein said resonant LO-phonon emission selectively depopulates the lower lasing state such that a ratio of a lifetime of said upper lasing state relative to lifetime of said lower lasing state is at least about 10.

3. The quantum cascade laser of claim 1, wherein said laser generates lasing radiation at an operating temperature above about 87 K.

4. The quantum cascade laser of claim 1, wherein the laser operates in a pulse mode.

5. The quantum cascade laser of claim 1, further comprising an electrical contact for applying a bias voltage across said semiconductor heterostructure.

6. The quantum cascade laser of claim 5, wherein said applied bias voltage causes a relaxation state of each lasing module to be in substantial resonance with an upper lasing state of an adjacent module to allow resonant tunneling of electrons therebetween.

7. The quantum cascade laser of claim 6, wherein electrons populating an upper lasing state of each lasing module exhibit a vertical optical transition into a lower lasing state of said module.

8. The quantum cascade laser of claim 5, wherein in each of said modules, said quantum wells generate a fourth state in substantial resonance with said lower lasing state upon application of said bias voltage.

9. The quantum cascade laser of claim 8, wherein electrons populating said fourth state exhibit relaxation via resonant LO-phonon scattering into said relaxation state.

10. The quantum cascade laser of claim 1, wherein in each of said lasing modules, said relaxation state is characterized by a wavefunction exhibiting substantial amplitude in a first one of said quantum wells, said upper lasing state is characterized by a wavefunction substantially concentrated in quantum wells other than said first quantum well, and said lower lasing state exhibiting sufficient amplitude in said first quantum well so as to cause a substantial phonon coupling between said lower lasing state and said relaxation state.

11. The quantum cascade laser of claim 10, wherein for each of said lasing modules, both of said upper and said lower lasing states exhibit substantial amplitudes in at least one of said quantum wells so as to allow a vertical optical transition between said upper and lower lasing states.

12. The quantum cascade laser of claim 1, further comprising an upper contact layer and a lower contact layer between which said semiconductor heterostructure is disposed.

13. The quantum cascade laser of claim 12, wherein said contact layers are formed of a heavily doped GaAs.

14. The quantum cascade laser of claim 13, wherein said contact layers are formed of GaAs having a doping level of about $3 \times 10^{18}$ cm$^{-3}$.

15. The quantum cascade laser of claim 1, wherein said semiconductor heterostructure is formed as a stack of alternating GaAs and $Al_{0.15}Ga_{0.85}As$ layers.

16. The quantum cascade laser of claim 15, wherein said heterostructure has a thickness in a range of about 1 to about 10 microns.

17. The quantum cascade laser of claim 1, further comprising a waveguide coupled to said semiconductor heterostructure for confining selected lasing modes of said laser.

18. The quantum cascade laser of claim 17, wherein said waveguide is formed of a metallic layer and a heavily doped semiconductor layer between which said semiconductor heterostructure is sandwiched.

19. The quantum cascade laser of claim 18, wherein said waveguide is formed of two metallic layers between which said semiconductor heterostructure is sandwiched.

20. The quantum cascade laser of claim 1, wherein a number of said lasing modules of said heterostructure range from about 100 to about 200.

21. The quantum cascade laser of claim 1, further comprising a semiconductor substrate on which said heterostructure is formed.

22. The quantum cascade laser of claim 21, wherein said substrate comprises a semi-insulating GaAs substrate.

23. A quantum cascade laser, comprising
a semiconductor heterostructure providing a plurality of lasing modules connected in series, each lasing module comprising
a plurality of quantum well structures collectively generating at least an upper lasing state, a lower lasing state, and a relaxation state such that said upper and lower lasing states are separated by an energy corresponding to an optical frequency in a range of about 1 to about 10 Terahertz and such that a radiative lasing transition between said upper lasing state and said lower lasing state is spatially vertical, and
wherein electrons populating said lower lasing state exhibit a non-radiative relaxation via resonant emission of LO-phonon into said relaxation state and wherein said resonant LO-phonon emission selectively depopulates the lower lasing state such that a ratio of a lifetime of said uppedr lasing state relative to a lifetime of said lower lasing state is at least about 5,
wherein the laser generates lasing radiation at an operating temperature above 130 K.

24. A terahertz amplifier, comprising
an amplification structure formed as a semiconductor heterostructure including a plurality of amplification modules connected in series, each module comprising
a plurality of quantum wells cooperatively generating an upper and lower amplification states and a relaxation state, said upper and lower states being separated in energy by a value corresponding to an optical frequency in a range of about 1 to about 10 Terahertz, said lower state being separated in energy from said relaxation state by a value substantially equal to an energy of at least one LO-phonon mode of said heterostructure such that electrons in said lower state exhibit relaxation into said relaxation state via resonant LO-phonon scattering, an input port for coupling an input signal in a frequency range of about 1 to about 10 Terahertz into said amplification structure to generate an amplified signal, and an output port for extracting said amplified signal from said amplification structure wherein said upper and lower amplification states exhibit a spatially vertical radiative transition and wherein a ratio of lifetime of said upper amplification state relative to that of said lower amplification state is at least about 5.

25. A quantum cascade laser, comprising a semiconductor substrate, a heterostructure formed on said semiconductor substrate, said heterostructure comprising a plurality of lasing modules connected in series, each of said modules comprising:

a plurality of quantum well structures collectively generating an upper lasing state, a lower lasing state, and a relaxation state, said upper and said lower lasing states having an energy separation corresponding to an optical frequency in a range of about 1 THz to about 10 THz, wherein a vertical transition between the upper lasing state and the lower lasing state generates lasing radiation and resonant LO-phonon scattering of electrons from said lower lasing state into said relaxation state depopulates said lower lasing state to facilitate generation of a population inversion between the upper and the lower lasing states.

wherein a rate of relaxation of said lower lasing state into the relaxation state is at least about 5 times higher than a corresponding rate associated with the upper lasing state.

26. The quantum cascade laser of claim 25, wherein said LO-phonon scattering of electrons from said lower lasing state into said relaxation state exhibits a rate in a range of about 0.1 to about 0.6 picoseconds.

27. A quantum cascade laser, comprising a semiconductor heterostructure providing a plurality of lasing modules connected in series, each lasing module comprising a plurality of quantum well structures collectively generating at least an upper lasing state, a lower lasing state, and a relaxation state such that said upper and lower lasing states are separated by an energy corresponding to an optical frequency in a range of about 1 to about 10 Terahertz, such that a radiative lasing transition between said upper lasing state and said lower lasing state is spatially vertical, and electrons populating said lower lasing state exhibit a non-radiative relaxation via resonant emission of LO-phonon into said relaxation state, and wherein a rate of relaxation of said lower lasing state into the relaxation state is at least about 5 times higher than a corresponding rate associated with the upper lasing state, and the laser generates lasing radiation at operating temperatures above about 87 K.

28. A quantum cascade laser, comprising a semiconductor heterostructure providing a plurality of lasing modules connected in series, each lasing module comprising a plurality of quantum well structures collectively generating at least an upper lasing state, a lower lasing state, and a relaxation state such that said upper and lower lasing states are separated by an energy corresponding to an optical frequency in a range of about 1 to about 10 Terahertz, said upper and lower lasing states exhibiting a spatially vertical radiative transition with an oscillator strength of about unity, wherein electrons populating said lower lasing state exhibit a non-radiative relaxation via resonant emission of LO-phonon into said relaxation state and wherein said resonant LO-phonon emission selectively depopulates the lower lasing state such that ratio of a lifetime of said upper lasing state relative to a lifetime of said lower lasing state is at least about 5.

* * * * *